United States Patent [19]
Yamazaki

[11] Patent Number: 5,888,862
[45] Date of Patent: Mar. 30, 1999

[54] METHOD FOR PRODUCING DYNAMIC RAM

[75] Inventor: Yasushi Yamazaki, Tokyo, Japan

[73] Assignee: NEC Corporation, Tokyo, Japan

[21] Appl. No.: 92,041

[22] Filed: Jun. 5, 1998

[30] Foreign Application Priority Data

Jun. 5, 1997 [JP] Japan ..................... 9-148106

[51] Int. Cl.$^6$ .............................................. H01L 21/8242
[52] U.S. Cl. ........................................... 438/238; 438/253
[58] Field of Search .................................. 438/238, 239, 438/253–256, 381, 396–399

[56] References Cited

U.S. PATENT DOCUMENTS

| | | | |
|---|---|---|---|
| 5,352,622 | 10/1994 | Chung | 437/52 |
| 5,488,011 | 1/1996 | Figura et al. | 437/60 |
| 5,824,591 | 10/1998 | Sakoh | 438/396 |

FOREIGN PATENT DOCUMENTS 63-94655  4/1988  Japan .

*Primary Examiner*—Joni Chang
*Attorney, Agent, or Firm*—Sughrue, Mion, Zinn, Macpeak & Seas, PLLC

[57] ABSTRACT

A contact hole and an opening(accessory mark) is formed in a insulation film. Then, a first polysilicon film is grown by reduced pressure CVD process. After a silicon oxide film which is to form a core of the cylindrical stack is grown by about 1300 nm by a normal pressure CVD process, the core silicon oxide film and the first polysilicon film is patterned. Next, using Chemical Mechanical Polishing process, the whole wafer surface is polished by about 900 nm to form a core oxide film having fully flat surface in a height of about 400 nm from the non-open part of contact. By this process, production of harmful particles at the time of removal of the core oxide film can be prevented. Accordingly, the product yield can be improved.

5 Claims, 4 Drawing Sheets

CELL PART | ACCESSORY PART

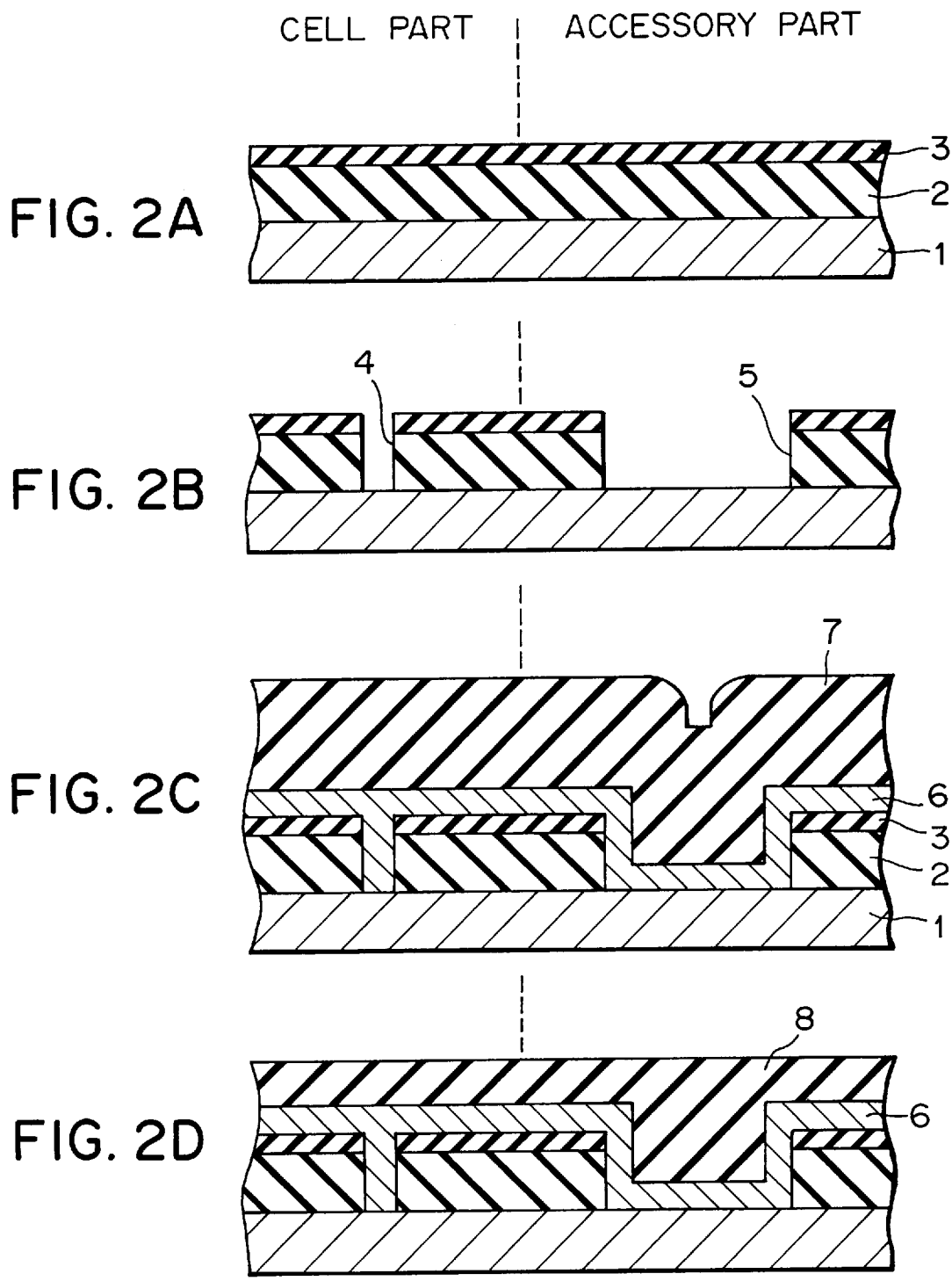

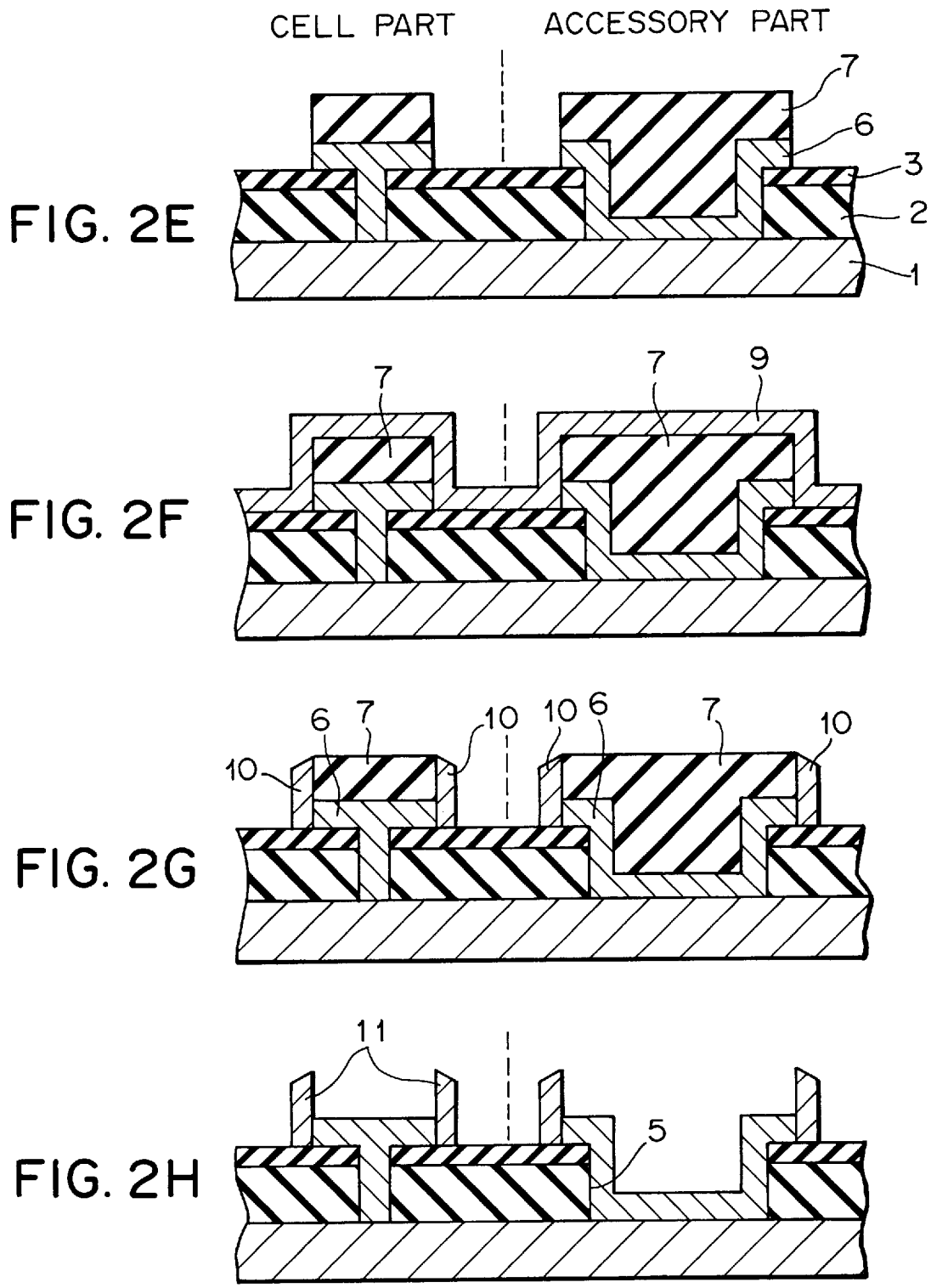

METHOD FOR PRODUCING DYNAMIC RAM

DETAILED DESCRIPTION OF THE INVENTION

1. Field of the Invention

The present invention relates to a method for producing a dynamic RAM in which the lower electrode has a cylindrical cell capacitor.

2. Related Art

A dynamic RAM (Random Access Memory) (hereinafter to be referred to as DRAM) having a capacitor cell of stack structure involves a problem that the capacity amount per cell shows decrease according to the integration of the device. As a countermeasure to cope with it, there is adopted in general a method of obtaining a greater surface area by increasing the stack height. However, as a result of such a method, there arise nonconformity's such that the step difference between the memory cell part and the peripheral part is enlarged to provide difficulty for processing the metal wiring to be formed on the upper part thereof, especially for the photolithography.

In the light of the above situation, there have been developed various techniques for constricting the cell size and securing the capacity amount without causing increase to the height of the stack electrode, of which the prevailing main current is a cylindrical stack structure which shows large capacity multiplication rate and high reliability.

FIGS. 1A–1G are sectional views of the process showing the conventional production method for DRAM having a cylindrical stack electrode.

At first, as shown in FIG. 1A, a P-type silicon substrate 1 is provided with element isolation necessary for the DRAM, formation of MOS transistor, cell bit wiring (not illustrated), etc., followed by growth of about 500 nm of boron phosphor glass (BPSG) by ordinary CVD technique. Thereafter, by providing annealing in nitrogen atmosphere at 900 degrees for 10 minutes, by which the BPSG is caused to reflow to give an under-stack BPSG film 2 of flat surface. Thereafter, an under-stack silicon nitride film 3 which becomes an etching stopper for the core oxide film is grown by about 20 by a reduced pressure CVD process.

Next, as shown in FIG. 1B, using a photolithography technique and a dry etching technique, there are formed simultaneously a cell node contact 4 at the node part of the DRAM cell, and the mark of the point matching process (hereinafter to be referred to as an accessory mark 5) to be continuously provided at the predetermined place around the semiconductor chip or in the scribe line. The caliber of the accessory mark in this case is 5–10 μm, which is very large in comparison with about 0.5 μm of the caliber of the capacity contact hole 4. For reference, the depth of the contact hole is about 700 μm in all cases.

As shown in FIG. 1C, next, the polysilicon film is grown by about 300 nm by a reduced pressure CVD process to form a first polysilicon film 6. Because the polysilicon film formed by reduced pressure CVD process has the excellent coverage, the cell node contact 4 having small caliber is fully buried by the polysilicon film, but the accessory mark 5 having large caliber is not buried.

Next, a silicon oxide film which is to form a core of the cylindrical stack is grown by about 400 nm by CVD process to form a core oxide film 7. Since the alignment mark is sufficiently large by three-fold the total film thickness or more of the first polysilicon film 6 and the core oxide film, the accessory mark 5 is not buried even at this time.

Then, as shown in FIG. 1D, a photolithography technique and a dry etching technique are used to pattern the core oxide film 7 and the first polysilicon film 6.

Then, as shown in FIG. 1E, in the same manner as in the first polysilicon film 6, the polysilicon film is grown by about 300 nm to form a second polysilicon film 9.

Then as shown in FIG. 1F, when the whole surface of the wafer is etched by the anisotropic dry etching technique, cylindrical cylinder side wall polysilicon 10 is formed on the side walls of the patterned core oxide film and the first polysilicon film.

Then as shown in FIG. 1G, when the whole surface of the wafer is etched by a chemical liquid containing hydrofluoric acid (HF), by the etching selectivity of the silicon nitride film and the silicon oxide film, only the core oxide film 7 is removed to form a cylindrical lower electrode 11 having the cylindrical inner wall height of about 400 nm and the outer wall height of about 700 nm.

However, according to the conventional production method as described above, when the whole surface of the wafer is etched by the anisotropic dry etching technique in the process shown in FIG. 1F, a polysilicon residue 12 is formed along the inner wall of the accessory mark 5 which has the large contact diameter. Because of this, in the next step of FIG. 1G, at the time of the etching with the chemical liquid, the polysilicon residue 12 is lifted off to form particles 13.

There has been such problem that the generated particles 13 scatter around and deposit on the product per se and other products in the semiconductor production apparatus to provide remarkable degradation of the product yield (about 20%).

SUMMARY OF THE INVENTION

An object of the present invention is to provide a method for producing a Dynamic RAM with which it is possible to expect improvement of the product yield by preventing production of harmful particles.

The method for producing Dynamic RAM according to the present invention comprises the steps of: forming simultaneously a contact hole of the cell node part and an opening in a first insulation film, said opening being larger than said contact hole; sequentially growing continuously a first polysilicon film and a second insulation film; polishing said second insulation film by CMP process to flatten the surface of said second insulation film; patterning said first polysilicon film and said second insulation film so as to cover the portions of said contact hole and said opening; growing a second polysilicon film; removing the second polysilicon film of a flat part by anisotropic etching; and removing said second insulation film on the first polysilicon film by chemical liquid.

Also, it is desirable that said opening is essentially for the production of the semiconductors including the alignment. Furthermore, the insulation film may be a silicon oxide film. Still further, it is desirable that the insulation film is a silicate glass containing boron or phosphorus. And, still further, the chemical solution is desirably an etching liquid containing hydrofluoric acid.

According to the DRAM production method of the present invention, a silicon oxide film which is a core of the cylindrical stack is grown, and then, prior to patterning, the core oxide film and the first polysilicon film are completely flattened by using the CMP process, thereby preventing production of harmful particles at the time of performing the succeeding process of removing the core oxide film and making it possible to obtain improved product yield.

BRIEF DESCRIPTION OF THE DRAWINGS

FIGS. 2A–2H are the sectional views showing the method for producing DRAM according to the embodiment of the present invention.

DESCRIPTION OF THE PREFERRED EMBODIMENT

Figure 1A:
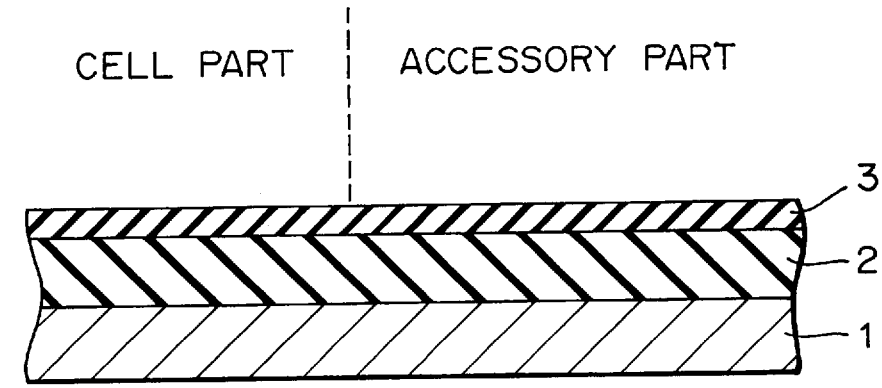
FIGS. 1A–1G are the sectional views showing the conventional method for producing DRAM having a cylindrical stack in order of process.
Figure 1B:
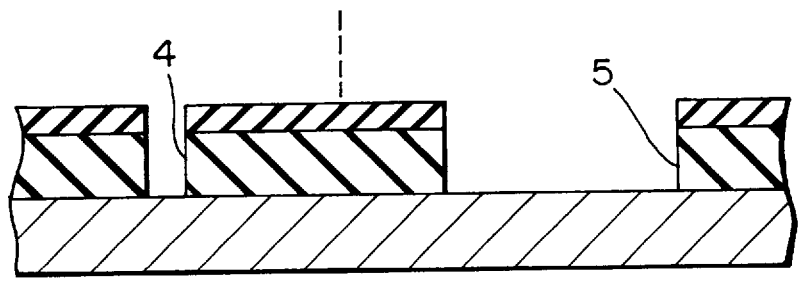
Figure 1C:
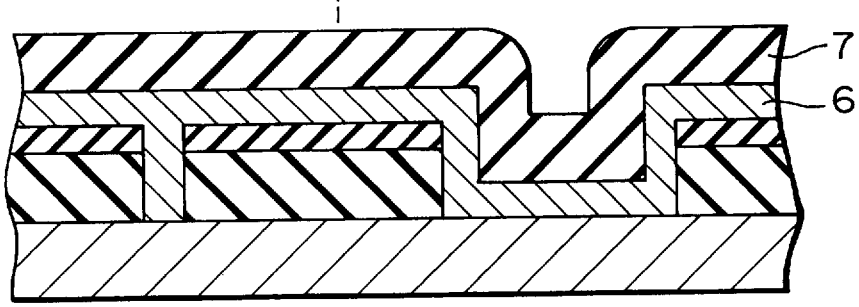
Figure 1D:
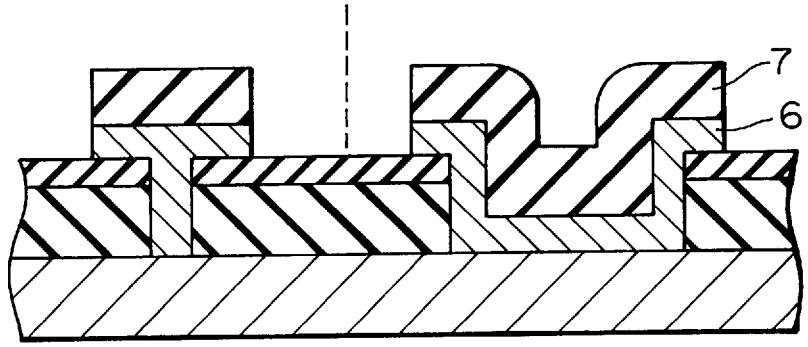
Figure 1E:
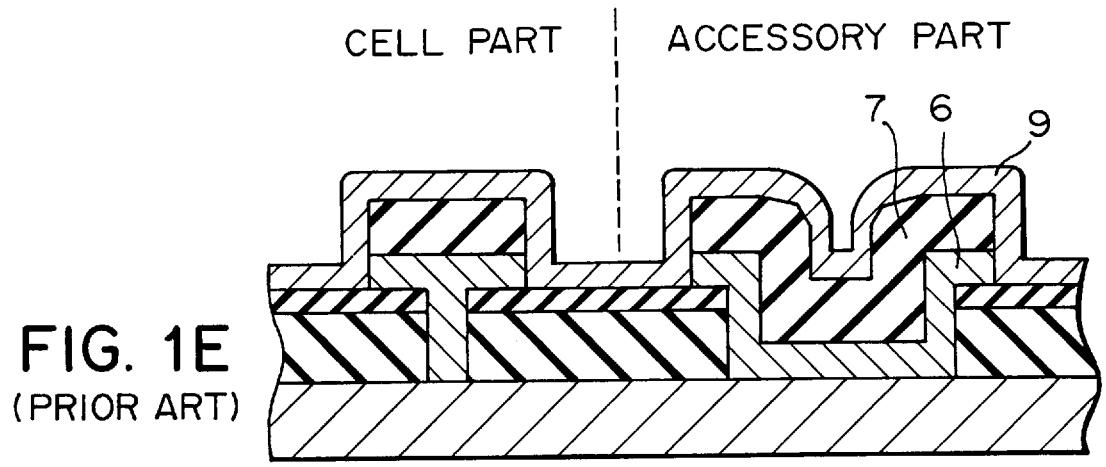
Figure 1F:
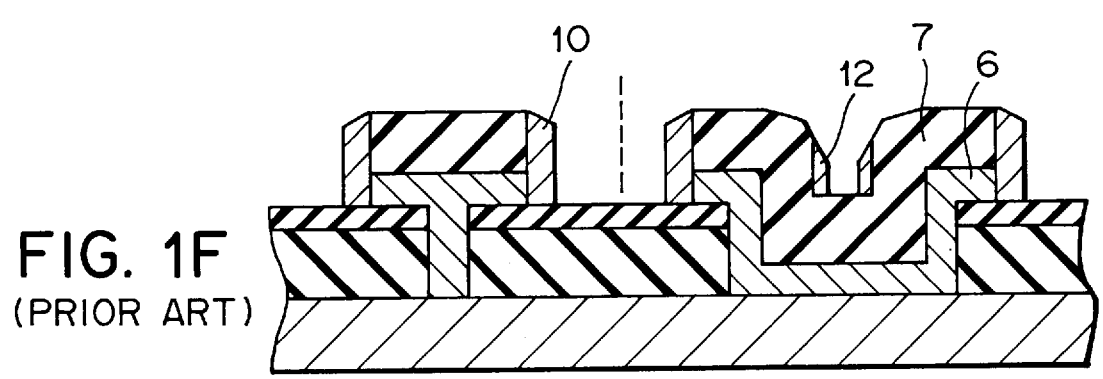
Figure 1G:
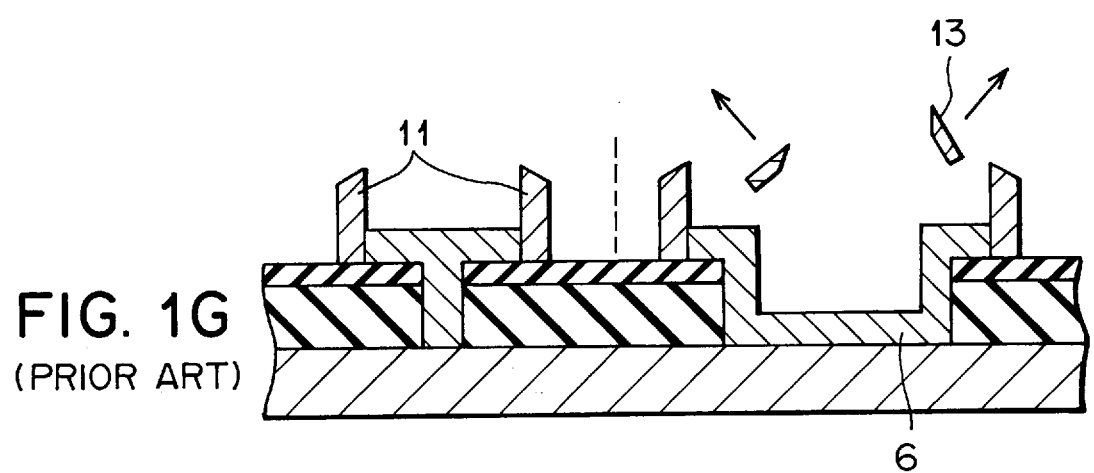

A preferred embodiment of the present invention will be described with reference to the accompanying drawings.

FIGS. 2A–2H are the sectional views showing the method for producing DRAM according to the embodiment of the present invention.

As shown in FIG. 2A, firstly, a P-type silicon substrate 1 is provided with element isolation region necessary for the ordinary DRAM, formation of MOS transistor, cell bit wiring (not illustrated), etc., followed by growth of about 500 nm of boron-phosphorus glass (BPSG) by ordinary CVD technique. Thereafter, annealing is provided in nitrogen atmosphere at 900° C. for 10 minutes, by which the BPSG is caused to reflow to give an under-stack BPSG film 2 of flat surface. Thereafter, an under-stack silicon nitride film 3 which becomes an etching stopper for the core oxide film is grown by about 20 nm by a reduced pressure CVD process.

Next, as shown in FIG. 2B, using a photolithography technique and a dry etching technique, there are formed simultaneously a cell node contact 4 at the node part of the DRAM cell, and the accessory mark 5 (opening) such as an alignment mark of the point matching process to be continuously provided at the predetermined place around the semiconductor chip or in the scribe line.

Then, as shown in FIG. 2C, a polysilicon film is grown by about 300 nm by a reduced pressure CVD process to form a first polysilicon film 6.

The steps to this stage are the same as those of the conventional production method for DRAM having a cylindrical stack.

Next, a silicon oxide film 7 which is to be a core of the cylindrical stack is grown by about 1300 nm by a normal pressure CVD process.

Since the depth of the contact hole is about 700 nm which is the same as that of the conventional one, the position of the surface of the core oxide film 7 in the alignment mark 5 is about 600 nm higher than the position of the surface of the first polysilicon film 6 at the unopened part of the contact.

Then, as shown in FIG. 2D, using Chemical Mechanical Polishing process (hereinafter to be referred to as CMP process), the whole surface of the wafer is polished by about 900 nm, by which a core oxide film having fully flat CMP polished surface 8 is formed in a position of about 400 nm above the contact unopened part.

Then, as shown in FIG. 2E, using a photolithography technique and a dry etching technique, the core oxide film 7 and the first polysilicon film 6 are patterned.

Next, as shown in FIG. 2F, in the same manner as in the first polysilicon film 6, a polysilicon film is grown by about 300 nm to form a second polysilicon film 9.

As shown in FIG. 2G, next, when the whole wafer surface is etched by the anisotropic dry etching technique, cylindrical cylinder side wall polysilicon 10 is formed on the side walls of the patterned core oxide film 7 and the first polysilicon film 6.

At this time, as the core oxide film 7 is fully flattened, unlike the conventional film, no remaining of polysilicon in the accessory mark 5 occurs.

Next, as shown in FIG. 2H, when the whole surface of the wafer is etched by a chemical liquid containing hydrofluoric acid (HF), by the etching selectivity of the silicon nitride film and the silicon oxide film, only the core oxide film 7 is removed to form a cylindrical lower electrode 11 having the cylindrical inner wall height of about 400 nm and the outer wall height of about 700 nm.

With respect to the subsequent steps, though illustration is omitted, by the continual use of a diffusion furnace, phosphorus doping is performed in the POC1 gas atmosphere (concentration about $1 \times 10^{19}$ cm$^{-3}$) to make the cylindrical lower electrode 11 conductive polysilicon, followed by forming a capacity insulation film comprising a silicon nitride film and the upper electrode comprising a polysilicon film to make the capacity part of the DRAM cell, in the same manner as in ordinary DRAM production method.

As described above, in the present embodiment, the silicon oxide film which is to be a core of the cylindrical stack is grown by about 1300 nm by normal pressure CVD, and then fully flattened by using the CMP process, prior to patterning the core oxide film 7 and the first polysilicon film 6, so that there is eliminated step difference in a large pattern such as an alignment mark, and the polysilicon can be removed in forming a cylindrical side wall part. Consequently, at the time of the continued step of removal of the core oxide film, generation of harmful particles 13 is prevented to expect improved product yield.

What is claimed is:

1. A method for producing a dynamic RAM wherein the lower electrode has a cylindrical cell capacitor, comprising the steps of:

forming simultaneously a contact hole of a cell node part and an opening in a first insulation film, said opening being larger than said contact hole;

continuously growing a first polysilicon film and a second insulation film sequentially;

polishing said second insulation film by Chemical Mechanical Polishing process to flatten a surface of said second insulation film;

patterning said first polysilicon film and said second insulation film in a manner to cover portions of said contact hole and said opening;

growing a second polysilicon film;

removing said second polysilicon film of a flat part by anisotropic etching; and removing the second insulation film on the first polysilicon film by chemical solution, thereby forming a cylindrical lower electrode.

2. The method for producing a dynamic RAM according to claim 1, wherein said opening is essentially for a production of semiconductors including an alignment.

3. The method for producing a dynamic RAM according to claim 1, wherein said second insulation film is a silicon oxide film.

4. The method for producing a dynamic RAM according to claim 1, wherein said second insulation film is a silicate glass containing boron or phosphorus.

5. The method for producing a dynamic RAM according to claim 1, wherein said chemical solution is an etching liquid containing hydrofluoric acid.

* * * * *